(12) United States Patent
Choi et al.

(10) Patent No.: US 10,868,521 B2
(45) Date of Patent: *Dec. 15, 2020

(54) LOW QUIESCENT CURRENT LOAD SWITCH

(71) Applicant: Texas Instruments Incorporated, Dallas, TX (US)

(72) Inventors: Jae Won Choi, Dallas, TX (US); Sungho Beck, Plano, TX (US); Abidur Rahman, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/543,110

(22) Filed: Aug. 16, 2019

(65) Prior Publication Data

US 2019/0372558 A1    Dec. 5, 2019

Related U.S. Application Data

(63) Continuation of application No. 16/119,457, filed on Aug. 31, 2018, now Pat. No. 10,432,175.

(Continued)

(51) Int. Cl.
*H03K 3/00* (2006.01)
*H03K 7/08* (2006.01)
(Continued)

(52) U.S. Cl.
CPC .............. *H03K 3/012* (2013.01); *H02M 1/08* (2013.01); *H02M 3/26* (2013.01);
(Continued)

(58) Field of Classification Search
CPC ............ H03K 3/012; H03K 17/04123; H03K 17/165; H03K 2217/0036; H03K 2217/0081; H02M 1/08; H02M 3/26
See application file for complete search history.

(56) References Cited

U.S. PATENT DOCUMENTS 5,828,245 A * 10/1998 Brambilla ............ H03K 17/163
327/108
6,011,416 A * 1/2000 Mizuno .............. H03K 17/0822
327/108

(Continued)

FOREIGN PATENT DOCUMENTS

WO    2006116710 A2    11/2006

OTHER PUBLICATIONS

Search Report for PCT Application No. PCT/US19/13085, dated Apr. 25, 2019, 1 page.

*Primary Examiner* — Kenneth B Wells
(74) *Attorney, Agent, or Firm* — Michael A. Davis, Jr.; Charles A. Brill; Frank D. Cimino

(57) ABSTRACT

Apparatus, devices, and systems to provide a low quiescent current load switch are disclosed. A disclosed load switch circuit includes a transconductor to convert a voltage to a current input to a transistor gate, the current input to the transistor gate to control the gate to deliver power to a load from a power supply. The example circuit includes a resistor to provide power from a charge pump to the gate as controlled by the transconductor. A disclosed apparatus includes a driver to control a gate of a transistor, the gate to enable the transistor to deliver power to a load from a power supply when the gate is activated, and a gate slope control to control a rate of change over time of a voltage associated with the gate to activate the gate and to disable the driver when the gate is activated.

12 Claims, 11 Drawing Sheets

Related U.S. Application Data

(60) Provisional application No. 62/615,728, filed on Jan. 10, 2018.

(51) Int. Cl.
*H03K 17/687* (2006.01)
*H03K 5/12* (2006.01)
*H03K 3/012* (2006.01)
*H02M 3/26* (2006.01)
*H03K 17/16* (2006.01)
*H03K 17/0412* (2006.01)
*H02M 1/08* (2006.01)

(52) U.S. Cl.
CPC ..... *H03K 17/04123* (2013.01); *H03K 17/165* (2013.01); *H03K 2217/0036* (2013.01); *H03K 2217/0081* (2013.01)

(56) References Cited

U.S. PATENT DOCUMENTS

| | | | | |
|---|---|---|---|---|
| 6,140,806 | A * | 10/2000 | Gohara | G05F 3/242 323/282 |
| 6,396,334 | B1 * | 5/2002 | Aram | H02M 3/073 327/541 |
| 6,400,203 | B1 * | 6/2002 | Bezzi | H03K 5/08 327/309 |
| 6,832,356 | B1 | 12/2004 | Ochi | |
| 9,268,350 | B2 * | 2/2016 | Forghani-zadeh | G06F 1/3296 |
| 9,312,852 | B2 * | 4/2016 | De Geeter | H03K 17/6871 |
| 9,571,068 | B1 | 2/2017 | Lin | |
| 9,584,115 | B2 | 2/2017 | Vogt et al. | |
| 10,432,175 | B2 * | 10/2019 | Choi | H02M 1/08 |

* cited by examiner

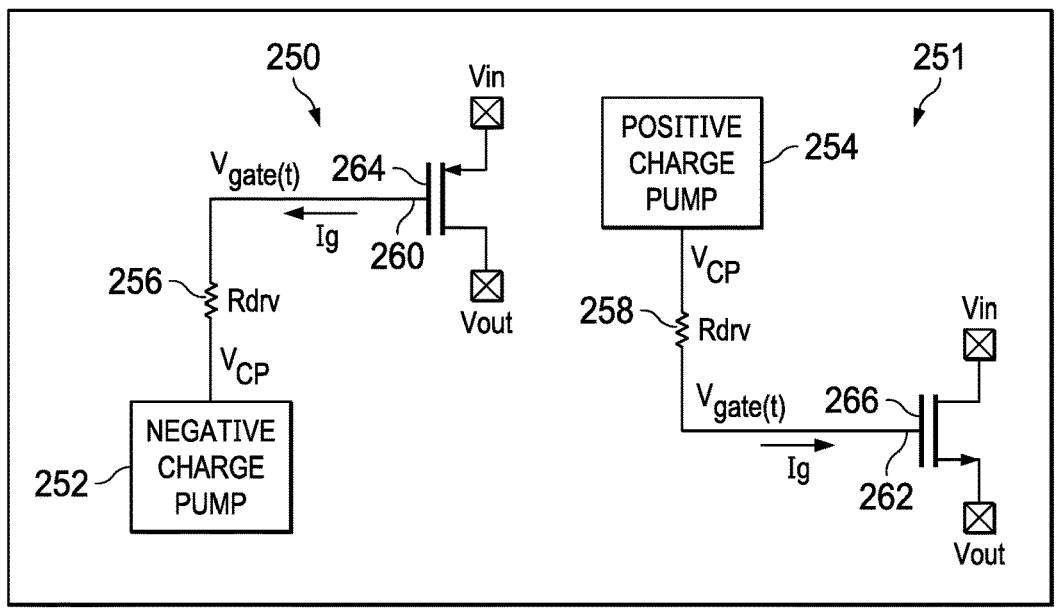
FIG. 2B
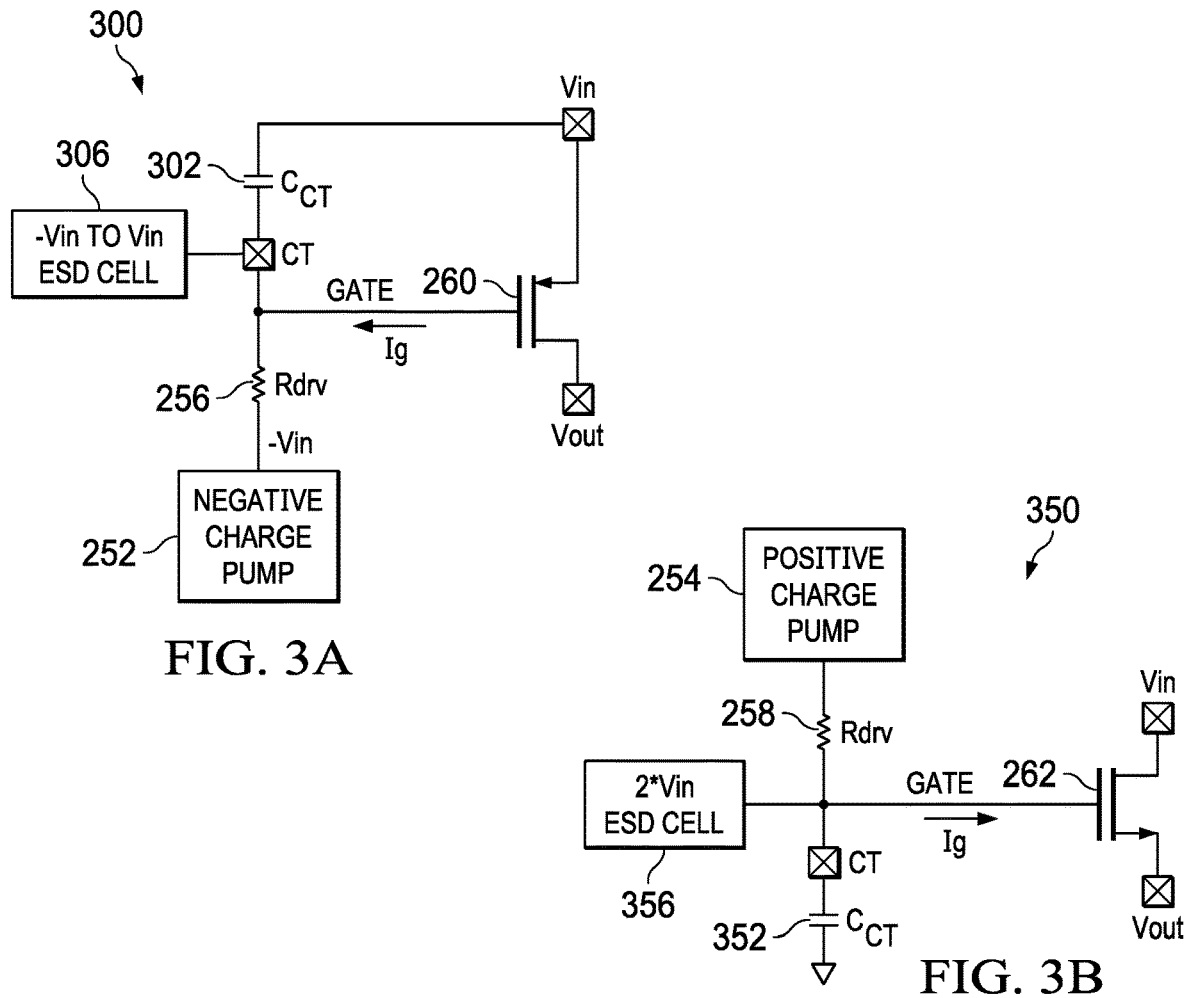
FIG. 3A
FIG. 3B

LOW QUIESCENT CURRENT LOAD SWITCH

RELATED APPLICATION

Under 35 U.S.C. § 120, this continuation application claims benefits of priority to U.S. patent application Ser. No. 16/119,457 (TI-79233), filed on Aug. 31, 2018, which claims the benefit of priority to U.S. Provisional Patent Application Ser. No. 62/615,728, filed on Jan. 10, 2018. The above referenced applications are hereby incorporated herein by reference in its entirety.

FIELD OF THE DISCLOSURE

This disclosure relates generally to power regulators, and, more particularly, to a low quiescent current load switch.

BACKGROUND

Power management integrated circuits (ICs) can be used to drive circuits in applications ranging from automotive to communications and industrial technologies. Power switches are commonly used to couple a power supply to a device such as a digital logic circuit or a memory cell. Load switches, such as integrated load switches, are IC relays used to turn on and off power rails. A basic load switch includes four connections: input voltage, output voltage, enable, and ground. An IC version of a load switch provides a smaller footprint than a load switch formed from discrete components. An IC load switch can be formed using a complementary metal-oxide-semiconductor (CMOS) process to include an output transistor and an output driver, for example. A load switch can be used in a system to improve power consumption by reducing current leakage, for example. When the load switch is turned on, current is allowed to flow from the input pin to the output pin, and power is passed to downstream circuitry.

SUMMARY

Certain examples provide a low quiescent current load switch. Certain examples provide a load switch circuit including a transistor including a gate, a source, and a drain; a transconductor connected to the gate of the transistor; a comparator connected to an input of the transconductor; a charge pump; and a resistor including a first terminal and a second terminal, the first terminal connected to the gate of the transistor and the second terminal connected to the charge pump.

Certain examples provide an apparatus including a driver to control a gate of a transistor, the gate to enable the transistor to deliver power to a load from a power supply when the gate is activated, and a gate slope control to control a rate of change over time of a voltage associated with the gate to activate the gate and to disable the driver when the gate is activated.

Certain examples provide a system including a power supply to generate a voltage. The example system includes a gate slope control and driver circuit to receive and convert the voltage to a current to activate a gate of a transistor to provide power from the power supply. The example system includes a device to receive the power from the power supply when the gate slope control and driver circuit activates the gate. In the example system, the gate slope control and driver circuit is to control activation of the gate at a rate of change over time corresponding to a rate of change in the current over time until the gate is activated and to disable the gate slope control and driver circuit when the gate is activated.

BRIEF DESCRIPTION OF THE DRAWINGS

FIG. 2B illustrates an example resistive driver implementation of the driver of FIG. 1A.

FIG. 3A illustrates an example PMOS load switch.

FIG. 3B illustrates an example NMOS load switch.

The figures are not to scale. Wherever possible, the same reference numbers will be used throughout the drawing(s) and accompanying written description to refer to the same or like parts.

DETAILED DESCRIPTION

Figure 1A:
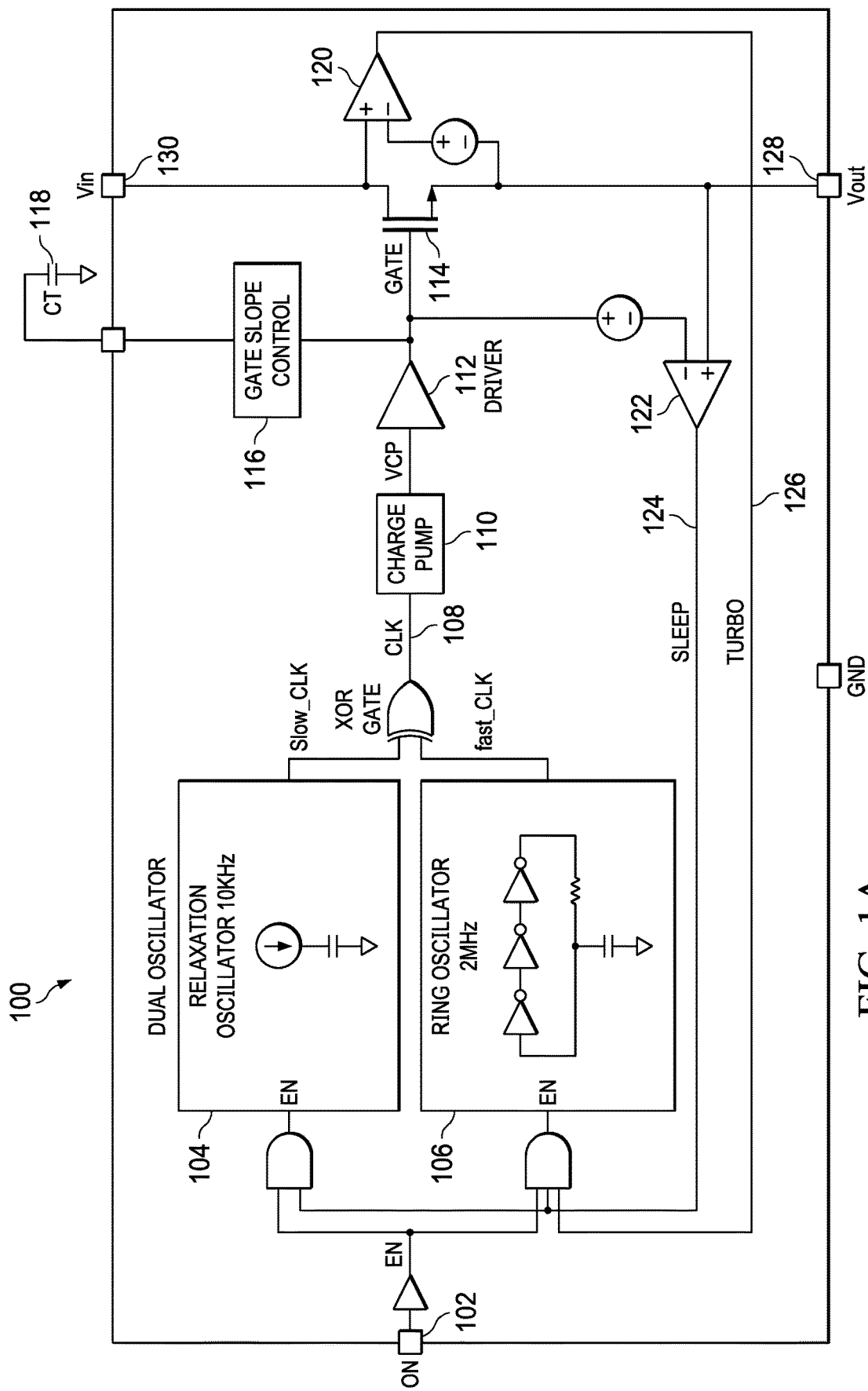
FIG. 1A illustrates an example load switch circuit to control power delivery to a load from a power supply.

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized and that logical, mechanical, electrical and/or other changes may be made without departing from the scope of the subject matter of this disclosure. The following detailed description is, therefore, provided to describe example implementations and not to be taken as limiting on the scope of the subject matter described in this disclosure. Certain features from different aspects of the following description may be combined to form yet new aspects of the subject matter discussed below.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Integrated load switches are electronic relays that can be used to turn on and turn off power supply rails in electrical systems. Load switches offer many benefits to an electrical system and can include protection features that are often difficult to implement with discrete components. For example, load switches can be used to regulate power distribution, power sequencing/power state transition, inrush current control, reduced leakage current in standby mode, controller power down, etc. Pass transistor logic, such as a pass field-effect transistor (FET), is activated (e.g., "turns ON") when the load switch device is enabled via its "ON" pin. Activation allows current to flow from an input pin to an output pin and power to pass to downstream circuitry connected to the switch.

The pass FET of the load switch determines a maximum input voltage and a maximum load current that the load switch can handle. An on-resistance of the load switch is a characteristic of the pass FET that can be used in calculating power dissipated by the load switch. The pass FET can be either an N-channel or P-channel FET, which will determine the architecture of the load switch. A gate driver charges and discharges the gate of the FET in a controlled manner, thereby controlling a voltage supply rise time of a device connected to the load switch. Control logic for the load switch is driven by an external logic signal. The control logic controls the turn-on and turn-off of the pass FET and other blocks, such as quick output discharge, a charge pump, and blocks with protection features.

A charge pump circuit uses capacitors and/or other storage elements to convert and, optionally, regulate voltage to generate an output voltage that can be higher or lower than the charge pump input voltage. A charge pump may not be included in a load switch but, if present, the charge pump can be used in load switches with a FET (e.g., a positive charge pump with an N-channel FET or a negative charge pump with a P-channel FET) because a positive differential voltage between the gate and the source (VOUT) is needed to turn on the FET properly.

A load switch can include a quick output discharge utilizing an on-chip resistor between VOUT and ground (GND). The resistor can be activated (e.g., turned on) when the load switch device is disabled via the ON pin. Activation will discharge the output node, thereby preventing the output from floating at an unpredictable voltage. Quick output discharge can be available to a load switch device when an input voltage (VIN) and a bias voltage (VBIAS) are within an operating range.

For example, many systems have limited control of sub-system power distribution. Load switches can be used to turn on and off sub-systems of the same input voltage rather than using multiple direct current (DC/DC) converters or low-dropout (LDO) regulators. By using a load switch, power can be distributed across different loads with control for each individual load.

In some systems, such as systems including a processor, there is a strict power-up sequence to be followed. By using a general-purpose input/output (GPIO) or inter-integrated circuit (I²C) interface, load switches can implement power sequencing to meet power-up requirements. Load switches can provide independent control of each power path to provide simplified point-of-load control for power sequencing.

In certain examples, some sub-systems are only used during certain modes of operation. Load switches can be used to limit an amount of leakage current and power consumption by turning off power to these sub-systems. In some applications, the circuitry, such as DC/DC converters, LDOs, modules, etc., can be disabled and put into standby mode. However, the leakage current of these modules can be relatively high, even in the shutdown state. By placing a load switch before the load, the leakage can be reduced to significantly lower levels. Thus, power consumption can be reduced significantly with a load switch placed in the power path.

An inrush current (also referred to as an input surge current or switch-on surge) is an instantaneous input current drawn by an electrical device when the device is turned on and can be several times larger than a normal operating current for a few cycles before reducing to normal current levels. Because the inrush current is sudden and larger than a normal operating current for the circuit, the inrush current can damage connected transistor devices (e.g., a FET such as a Power-FET, etc.), power path circuitry through which the input power flows, and/or other connected circuits, etc.

In certain examples, when turning on a sub-system without any voltage supply slew rate control, a voltage supply rail can sag (e.g., dip or temporarily decrease) due to an inrush current that can happen from quickly charging capacitance. The sagging voltage supply rail can be problematic as this rail may be supplying power to other sub-systems. Load switches solve this issue by controlling the rise time of the output voltage, thereby eliminating the sag on the input voltage.

In certain examples, when a DC/DC converter or LDO without quick output discharge turns off, the load voltage is left floating and power down is dictated by the load. This can cause unwanted activity as modules downstream are not powered down to a defined state. Using a load switch with quick output discharge can mitigate these problems. The load can be powered down quickly in a controlled manner and reset to a known good state for the next power up. The quick, controlled power down and reset can eliminate floating voltages at the load and help ensure that the device is in a defined power state.

Certain applications can include fault protection features to be integrated into the load switch. Some load switches include integrated features such as reverse current protection, ON pin hysteresis, current limiting, undervoltage lock-out and over temperature protection, etc. Rather than implementing these complex circuits through discrete components, part count, solution size, and development time can be reduced using an integrated load switch.

Protection features can include reverse current protection to stop current from flowing from the VOUT pin to the VIN pin. In the absence of this feature, current may flow from the VOUT pin to the VIN pin, if the voltage on VOUT is greater than VIN by a diode drop. Thus, reverse current blocking can be beneficial in certain applications, such as in a power mux application, where current should not flow from VOUT to VIN.

Protection can also include reverse current protection. There are many different methods of implementing reverse current protection. In some examples, the device monitors the voltage levels at the VIN pin and VOUT pin. When this differential voltage exceeds a certain threshold, the switch is disabled, and the body diode is disengaged to prevent any reverse current flow to VIN. Some devices have reverse current protection when the device is disabled.

In some examples, ON pin hysteresis allows for more robust GPIO enable. With a voltage difference between a logic level high and logic level low on the ON pin, control circuitry operates as intended when there is noise on the GPIO line.

In certain examples, over temperature protection disables the switch if the temperature of the device exceeds a threshold temperature. With this feature, the device can operate as a safety switch that turns off when a high temperature is detected.

Using an integrated load switch can lower the part count of a system. If there are discrete FETs that are used in conjunction with other components, a load switch could be considered to reduce the number of total components in the system. When a load switch is created discretely, there are many resistors, capacitors and transistors required to implement a gate driver, control logic, output discharge and protection features. With an integrated load switch, this is accomplished with a single device, and the part count is significantly reduced.

Quiescent current ($I_Q$) is a small current that flows when the load switch device is in an inactive state (e.g., idle, asleep, off, etc.). For example, a device that is turned on but in a minimal or reduced state (e.g., an amplifier IC that is on and ready to operate (e.g., enabled) but is not currently amplifying anything, etc.) consumes $I_Q$. For example, quiescent current is the current drawn when the load switch device is enabled and there is no load on the output. The $I_Q$ is a result of the power needed for the many different parts of the load switch, such as charge pump, gate driver, control logic, etc. That is, the load switch can include a quiescent current to provide a low on-resistance (RON) across input voltages. Quiescent current dictates minimum power consumption of a circuit, maximum battery life of a device, etc.

In certain examples involving load switches, the quiescent current passes through the device to the ground connection, rather than through the pass FET. A quiescent current for a load switch is typically in the microamp (μA) range, for example. In such examples, for an output load in milliamps (mA) or higher, such as an LED, the quiescent current becomes a negligible percentage because the quiescent current is small compared to the current needed to power the entire system. However, the quiescent current is not negligible while the load switch is disabled/off.

Certain examples described herein provide a low quiescent current, low-cost switch mode power regulator load switch. Certain examples described herein provide an associated zero-$I_Q$, low cost external capacitor-based constant gate slope control method for a load switch powering electronics. While some approaches utilize a current mirror driver, for fast rise time, low quiescent current, and small area, as described herein, a gate driver can be a resistive driver instead of a current mirror driver. Certain examples employ a resistive gate driver to facilitate zero-$I_Q$, constant gate slope load switch control with capacitor current decreasing at the same rate as capacitor voltage (e.g., same slope of decrease or discharge) to provide a stable, low quiescent current to control the load switch without current leakage.

FIG. 1A illustrates an example load switch circuit 100 to control power delivery to a load from a power supply. The example load switch circuit 100 includes an enable or "on" signal input 102 which, in turn, enables dual oscillators 104, 106 to generate clock input 108 for a charge pump 110. In the example of FIG. 1A, a first oscillator 104 is a relaxation oscillator (e.g., 10 kHz, etc.) providing a slow clock signal that is XORed with a fast clock signal generated by the second oscillator 106 implemented as a ring oscillator (e.g., 2 MHz, etc.) to provide the clock signal 108 to the charge pump 110.

The charge pump 110 is a power source for a gate driver 112, providing a charge pump voltage, $V_{CP}$, to driver 112, which can then provide power to a gate 114. The driver 112 turns on the load switch 100 with the charge pump 110 to reduce on-resistance. A resistive driver 112 can provide smaller area, fast turn-on time, and zero IQ, for example. A gate slope control 116 can modify power-up of the gate 114 using an external capacitor 118 to control an in-rush current for soft start-up. Depending on the gate slope control 116, the driver 112 can deliver a fast main switch turn-on from the charge pump 110 in turbo mode. A state-of-charge (SOC) detector 122 turns off the oscillator(s) 104, 106 and charge pump 110 with a sleep signal 124 once the gate 114 turns on completely for low power. Once the gate 114 is activated, a comparator 120 can generate a turbo signal 126 to boost charging of VOUT 128 to VIN 130. The turbo comparator 120 detects when VOUT is smaller than VIN—offset voltage and trips the turbo signal 126 high which enables the ring oscillator 106 (e.g., fast frequency such as 2 MHz, etc.). A high frequency clock 108 makes the charge pump 110 stronger to support a large driver current for a fast VOUT 128 turn-on feature with a small capacitor CT 118.

Figure 1B:
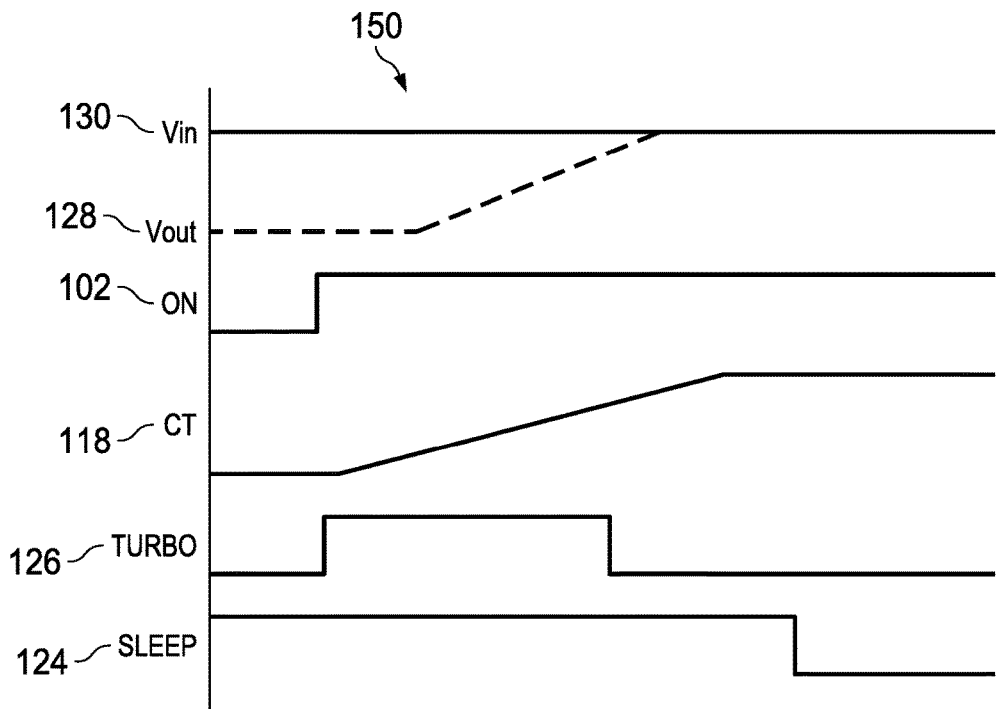
FIG. 1B illustrates a timing diagram for the example circuit of FIG. 1A.

FIG. 1B illustrates a timing diagram 150 for the example circuit 100 of FIG. 1A. As shown in the example diagram 150, the on signal 102 activates the circuit 100 to elevate VOUT 128 to VIN 130. The capacitor CT 118 charges with a constant reference current IREF which makes a constant CT voltage slope=Cct/IREF, where Cct is a capacitance value of the capacitor CT. In certain examples, VIN 130 powers the reference current IREF and the capacitor CT 118 to generate a controlled voltage slope. The turbo signal 126 is used to run the clock 108 faster by enabling the 2 MHz ring oscillator 106 to support a large driver current that loads the charge pump 110 when VOUT is lower than VIN, for example. When the main switch is powered on, as verified by the SOC detector 122, the sleep signal 124 is activated (e.g., trips low), allowing the circuit 100 to operate in low power mode.

Figure 2A:
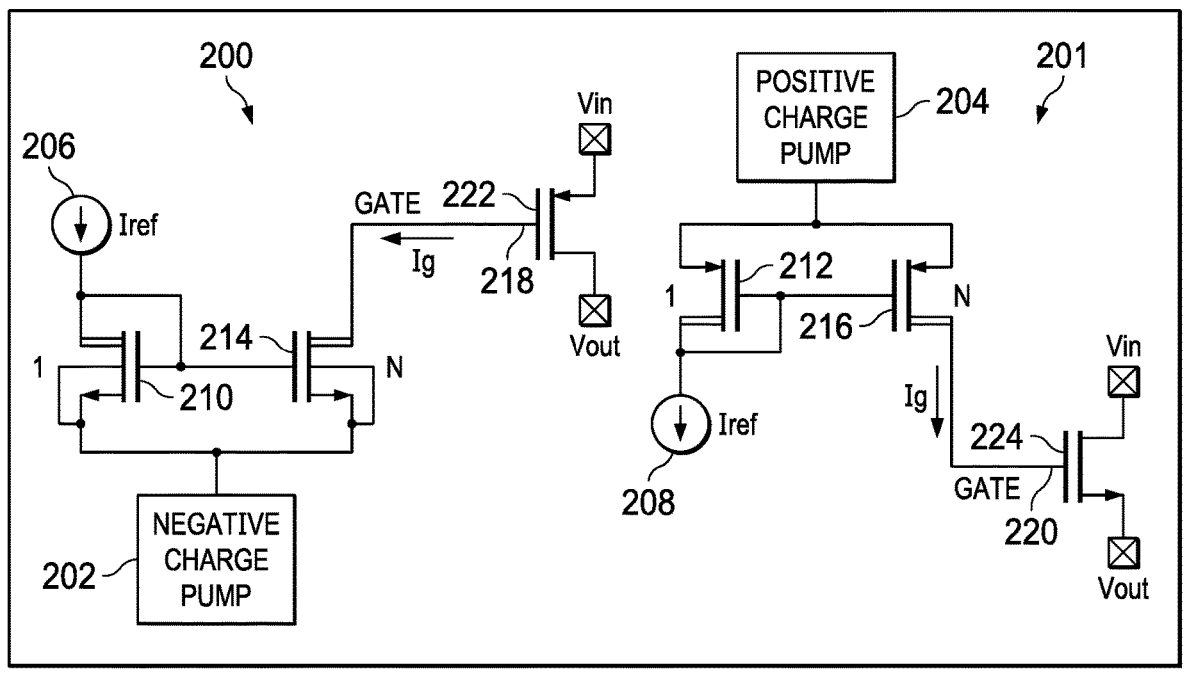
FIG. 2A illustrates an example current mirror driver implementation of the driver of FIG. 1A.

FIGS. 2A and 2B illustrate a comparison between different implementations of the driver 112 of the example of FIG. 1A: a pair of current mirror drivers (FIG. 2A) and a pair of resistive drivers (FIG. 2B). FIG. 2A shows an example current mirror driver circuit 200, 201 shown with both a negative charge pump 202 for a P-channel FET-based circuit 200 and a positive charge pump 204 for an N-channel FET-based circuit 201. While both a positive charge pump 202 and negative charge pump 204 would not be used together with the same transistor, they represent complementary implementations to be used with the driver 112 depending on the type of transistor (e.g., the negative charge pump 202 for a P-channel FET 200 and the positive charge pump 204 for an N-channel FET 201, etc.) used to implement the driver 112. In the example pair of current mirror driver circuits 200, 201, reference current sources 206 and 208 each provide a reference current, $I_{REF}$. The current at transistor circuit 210, 212 is mirrored at transistor circuit 214, 216, to generate a gate current, Ig, corresponding to the $I_{REF}$ current source 206, 208, for example.

As shown in the example of FIG. 2A, the gate current, Ig, is generated at a ratio of 1 to N (e.g., a current mirror ratio of 1:N) since a width of the transistor device 214, 216 is N times larger than a width of the transistor device 210, 212. For example, Ig can be calculated as:

$$Ig = N * I_{REF} \qquad (Eq.\ 1).$$

Thus, in the example of FIG. 2A, the charge pumps 202, 204 work with the reference current sources 206, 208 and transistors 210-216 to create a gate current, Ig, that mirrors the reference current, $I_{REF}$, sources 206, 208 to enable the load switch via a gate 218, 220.

As shown in the example of FIG. 2A, the switch is disabled and can be enabled by applying Ig to the gate 218, 220. When Ig is supplied to the gate 218, 220, the gate 218, 220 is turned "on", which turns on the load switch. When the gate 218, 220 is on, current flows through an associated transistor device (e.g., a power-FET, etc.) 222, 224 from source to drain, which provides electricity from a power source (VIN) to a connected load such as an electronic device (VOUT). The value of Ig determines how quickly or how slowly the switch 200, 201 turns on (is enabled). For example, the smaller the Ig, the slower the switch turns on, which produces less inrush current. In certain examples, to disable the switch quickly, drain-extended p-type metal-oxide-semiconductor (PMOS) logic can be used to pull up the gate 218 to disable the PMOS switch, and drain-extended n-type metal-oxide-semiconductor (NMOS) logic can be used to pull down the gate 220 to disable the NMOS switch.

FIG. 2B shows a pair of example resistive driver circuits 250, 251 including a P-channel FET circuit 250 with a negative charge pump 252 and an N-channel FET circuit 251 with a positive charge pump 254. While both a positive charge pump 252 and negative charge pump 254 would not be used together with the same transistor, they represent complementary implementations to be used with the driver 112 depending on the type of transistor (e.g., the negative charge pump 252 for a P-channel FET and the positive charge pump 254 for an N-channel FET, etc.) used to implement the driver 112. Rather than the current mirror of circuits 200, 201, the resistive drivers 250, 251 include a driver resistor, Rdrv, 256, 258 associated with the negative charge pump 252 and positive charge pump 254, respectively, and attached to a gate 260, 262. Thus, in the example of FIG. 2B, the charge pumps 252, 254 work with the resistors Rdry 256, 258 to create a gate current, Ig, to enable the load switch via the gate 260, 262.

The resistive driver 250, 251 occupies a smaller circuit footprint than the current mirror driver 200, 201, provides faster turn-on than the current mirror driver 200, 201, has lower $I_Q$ than the current mirror driver 200, 201, costs less to produce than the current mirror driver 200, 201, etc. Using the resistive driver 250, 251, no reference current, $I_{REF}$, is provided to the charge pump 252, 254, and, therefore, extra quiescent current introduced by the reference current is avoided. Further, the resistive driver 250, 251 does not require an isolated drain-extended device to disable the load switch, which is not available in low-cost processes and is required by the current mirror implementation of FIG. 2A.

However, the resistive driver 250, 251 provides a current that is not constant. The varying current in the resistive driver 250, 251 results in an inrush current applied to the switch when the switch is turned on that is also not constant. As described above, a varying or unpredictable inrush current can damage the switch when the inrush current is greater than a current capacity or threshold for which the switch was designed. A load-switch gate slope and a VOUT slope associated with the resistive driver circuit 250, 251 can also be variable (not constant). The load-switch gate slope is a rate of change in gate voltage, Vgate(t), over time. The gate slope depends on driver resistance, gate capacitance, input voltage, and charge pump voltage, for example. Gate slope can change exponentially based on driver resistance and gate capacitance, for example. The VOUT slope is a rate of change in output voltage, VOUT, over time. NMOS load-switch VOUT slope is equal to gate slope, and PMOS load-switch VOUT slope depends on a transconductance, $g_m$ (describing a ratio between output current and input voltage of the load switch), output resistance, driver resistance, gate capacitance, input voltage, and charge pump voltage, for example.

An inrush current peak (e.g., a maximum value of the inrush current) varies with charge pump 252, 254 voltage, $V_{CP}$, and variation in the driver resistor, Rdrv, 256, 258, so the inrush current is difficult to control. An unstable or unpredictable inrush current can be difficult to protect circuitry against, potentially resulting in damage to connected circuit components, for example. Inrush current flows from an input power supply (VIN) through a transistor 264, 266 (e.g., power-FET transistor, etc.) channel to an attached electronic device (VOUT). The inrush current is problematic because the power supply (VIN), connected transistor 264, 266, connected electronic device(s) (VOUT), and the circuit path between VIN and VOUT (the power path) are designed for a particular current capability. Therefore, an inrush current larger than the current capability for which circuitry is designed can damage that circuitry. Additionally, the inrush current can cause a decrease or "sag" in the power supply voltage, YIN, which provides power to other subsystems as well. This power supply sag can trigger a system reset, for example.

Gate current, Ig(t), can be calculated using a charge pump voltage. $V_{CP}$, a gate voltage Vgate(t), and driver resistance, Rdrv, as:

$$Ig(t) = \frac{V_{CP} - Vgate(t)}{Rdrv}. \qquad (Eq.\ 2)$$

Thus, as the gate voltage, Vgate(t), increases as a function of time, Ig(t) reduces. By managing gate current, Ig(t), charge pump voltage, $V_{CP}$, gate voltage, Vgate(t), and/or driver resistance, Rdiv, an impact of inrush current on the circuit 250, 251 can be mitigated. The following examples provide strategies to improve upon and/or replace the resistive driver circuit 250, 251 to control the load switch with improved reliability and reduced potential for damage to the circuit 250, 251 and surrounding circuitry through inrush current, quiescent current, etc.

As shown in the example PMOS load switch 300 of FIG. 3A, a direct current external capacitor, CT, 302 can be attached to the gate 260 and an electrostatic discharge (ESD) cell 306, which is a protection circuit that protects the device from electrostatic discharge, can be connected as well. The external capacitor 302 at the gate 260 can be used for rise time control of a current mirror load driver switch. However, in a resistive driver load switch with the driver resistor Rdry 256 coupled between the negative charge pump 252 and the gate 260, the presence of the external capacitor CT 302 results in an exponential change in gate slope (e.g., the gate slope is then based on Rdiv($C_G$+$C_{CT}$) time constant, where $C_G$ is a capacitance associated with the gate 260 and $C_{CT}$ is a capacitance associated with the capacitor 302) and high quiescent current (e.g., due to leakage current generated by the ESD cell 306) such that a high voltage rating external capacitor is required.

For example, the gate 260 discharges exponentially with a Rdrv($C_G$+$C_{CT}$) time constant. Ig(t) can be defined as in Equation 2, and a change in gate 260 voltage over time, referred to as gate slope, can be defined as:

$$\frac{dV_{gate}}{dt} = -\frac{1}{Rdrv(C_G + C_{CT})}(VIN - V_{CP})e^{-\frac{1}{Rdrv(C_G C_{CT})}\tau}. \quad \text{(Eq. 3)}$$

As shown in Equation 3, peak inrush current varies with input supply voltage and Rdry variation. This is important because a customer uses the single external capacitor CT 302 to prevent a large inrush current in multiple input supply voltage conditions. Additionally, the wide voltage range (e.g., –VIN to VIN) ESD device 306 creates a leakage current to the load-switch gate 260, and its effect is multiplied by the charge pump 252 gain, so $I_Q$ is increased. That is, the circuit of FIG. 3A produces a higher quiescent current due to the leakage current generated by the –VIN to VIN ESD cell 306. The ESD cell 306 can be large and have a wide width, thereby producing a leakage current that is not negligible. The leakage current charges the gate 260, and the SOC detector 122 detects the charge on the gate 260. The detector 122 wakes the device 100 from sleep mode 124 to run the oscillator 104, 106, charge pump 110, and driver 112 to discharge the charge formed by the leakage current from the ESD cell 306. Thus, the leakage current from the ESD cell 306 wakes up the device 100 more frequently and increases quiescent current. As discussed further below, by isolating a capacitor, CT, to the gate 260, quiescent current is not impacted by an ESD cell leakage current, resulting in a lower quiescent current, for example.

Similar effects are exhibited in an NMOS load switch 350 such as shown in the example of FIG. 3B. The example NMOS load switch 350 includes an external capacitor CT 352, attached to the gate 262 and wide voltage range (e.g., 0V to 2*VIN) ESD cell 356. The resistor Rdry 258 is also attached between the positive charge pump 254 and the gate 262.

Figure 4:
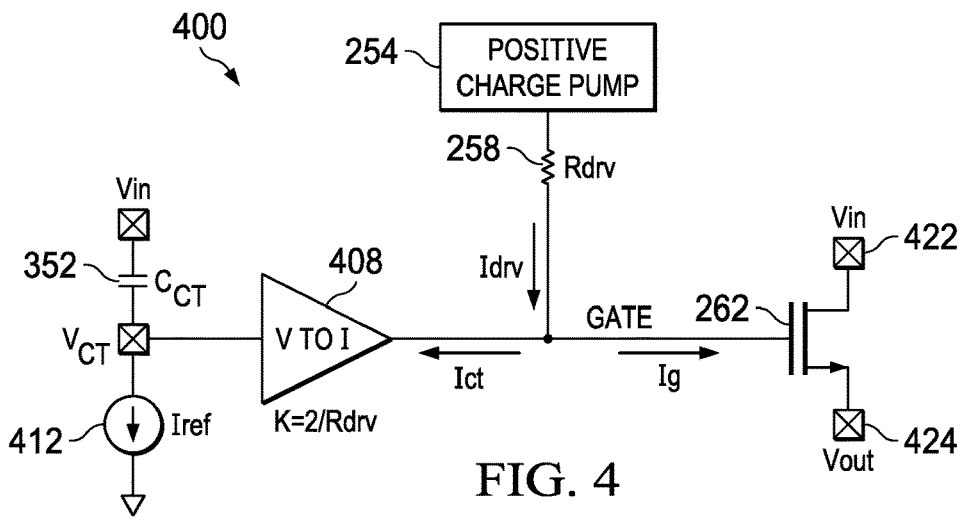
FIG. 4 illustrates an example NMOS constant gate slope control and driver circuit.

FIG. 4 illustrates an example NMOS constant gate slope control and driver circuit 400 with driver cancellation current, Ict. The example circuit 400 includes the positive charge pump 254, the driver resistor, Rdrv, 258, the gate 262, a V to I transconductor 408 to convert a voltage to a current, a capacitor, CCT, 352, and a reference current, $I_{REF}$, source 412. The charge pump 254 and driver resistor 258 form and/or replace the charge pump 110/driver 112 combination shown in FIG. 1A, and the transconductor 408, capacitor 352, and reference current source 412 form and/or replace the gate slope control 116/capacitor 118 combination shown in FIG. 1A, for example. The introduction of Ict from the capacitor 352 and transconductor 408 helps to stabilize a driver current, Idrv, to provide a constant slope for change in gate 262 voltage (e.g., a constant gate slope), and the transconductor 408 provides separation between the capacitor 352 and the gate 262 to avoid or reduce leakage current, for example.

As shown in the example of FIG. 4, the driver current, Idrv, flows through the resistor 258, and a gate current, Ig, flows to the gate 262. Using the example circuit 400, a capacitor 352 voltage, $V_{CT}$, is converted to a capacitor current, Ict, by the transconductor 408 with a gain of 2/Rdrv. Initially, Ict and Idry can be equal so that no current flows to the gate 262 (Ig=0), but a slowly changing linear Ict (cancellation current) interacts with a fast-changing Idry from the resistor 258 such that the gate 262 voltage has a linear (constant slope). In certain examples, a time constant associated with the Ict is larger than a time constant associated with Idry (e.g., for a large CT 352). As a result, Idry tracks Ict closely and becomes a constant slope for the gate 262, with a gate slope, dVgate/dt, with respect to a power supply 422 providing an input voltage VIN and an electronic device 424 connected to an output voltage VOUT, constant at twice $V_{CT}$ slope, for example:

$$\frac{dV_{gate}}{dt} = 2\frac{IREF}{C_{CT}}. \quad \text{(Eq. 4)}$$

In certain examples, a determination of NMOS load-switch constant gate slope can be calculated over time, t, for an input voltage, \TIN, as follows:

$$I_g = C_G \frac{dV_{gate}}{dt}, \quad \text{(Eq. 5)}$$

wherein $C_G$ is a capacitance of the gate 262;

$$I_{drv} = \frac{V_{gate}(t) + VIN}{R_{drv}}; \quad \text{(Eq. 6)}$$

$$I_{CT} = \frac{2V_{CT}(t)}{R_{drv}}; \quad \text{(Eq. 7)}$$

$$I_g = I_{drv} - I_{ct}; \quad \text{(Eq. 8)}$$

$$\frac{dV_{gate}}{dt} = \quad \text{(Eqs. 9-11)}$$

$$\frac{V_{gate}(t) + VIN}{C_G R_{drv}} - \frac{2V_{CT}(t)}{C_G R_{drv}} \begin{cases} V_{gate}(t) = VIN - \frac{dV_{gate}}{dt}*t \\ V_{CT}(t) = VIN - \frac{IREF}{C_{CT}}*t \end{cases};$$

$$\frac{dV_{gate}}{dt} = \frac{\frac{2VIN}{C_G R_{drv}} - \frac{2VIN}{C_G R_{drv}} + \frac{2IREF*t}{C_{CT}C_G R_{drv}}}{1 + \frac{t}{C_G R_{drv}}}; \text{ and} \quad \text{(Eq. 12)}$$

$$\frac{dV_{gate}}{dt} = \frac{\frac{2IREF*t}{C_{CT}C_G R_{drv}}}{1 + \frac{t}{C_G R_{drv}}}. \quad \text{(Eq. 13)}$$

If the time scale $$\left(\frac{C_{CT}}{IREF}\right)t \gg C_G R_{drv},$$

then Equation 13 can be simplified as:

$$\frac{dV_{gate}}{dt} = 2\frac{IREF}{C_{CT}}, \quad \text{(Eq. 14)}$$

also shown in Eq. 4 above. Equation 14, representing a gate slope for the example circuit 400 of FIG. 4, can be compared to Equation 3, representing a gate slope for the example circuit 300 of FIG. 3A. Rather than the exponential gate slope of Equation 3, the example circuit 400 provides a constant gate slope as represented in Equation 14.

Figure 5A:
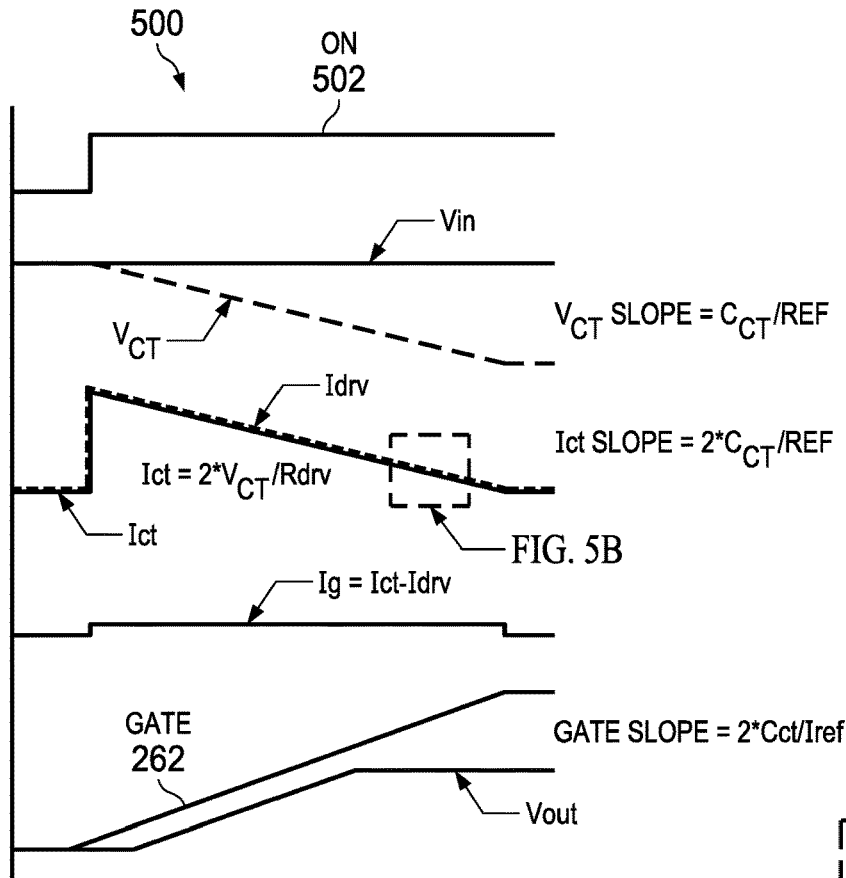
FIGS. 5A-5B show an example timing diagram for the circuit of FIG. 4.
Figure 5B:
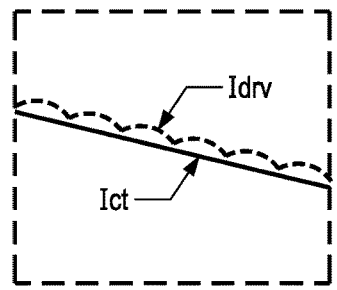

As shown in the example timing diagram 500 of FIG. 5A, when the circuit 400 is activated or turned "on" 502, Vct begins to decrease from input voltage VIN with a slope of Vct Slope=Cct/$I_{REF}$. After an initial ramp-up with power on 502 (Ict=2*Vct/Rdrv), Ict similarly decreases with a slope of Ict Slope=2*Cct/$I_{REF}$, and Idrv approximately follows Ict. Gate current Ig stays relatively constant at Ig=Ict−Idrv, and gate 262 slope increases along with VOUT, which plateaus as Vct and Ict reach the end of their downward slope. Thus, Gate Slope=2*Cct/$I_{REF}$, for example. FIG. 5B shows an example magnification of the relationship between Ict and Idrv, with Idrv approximating the slope of Ict.

While the above equations are determined for a single-stage charge pump 254, a number of stages can be used depending upon the circuit implementation. The equations can be extended for an N-stage charge pump 254 (e.g., 2-stage, 3-stage, etc.). Thus, more generally, for an N-stage charge pump 254, V to I transconductor 408 gain can be represented as: (1+N)/Rdrv. That is, with a single-stage charge pump 254 (e.g., positive charge pump $V_{CP}$=2*VIN for an N-channel (NCH) load switch and negative charge pump $V_{CP}$=−VIN for a P-channel (PCH) load switch with initial gate to charge pump voltage difference=2*VIN). If a two-stage charge pump 254 is used, the positive charge pump $V_{CP}$=3*VIN for an NCH load switch and the negative charge pump $V_{CP}$=−2VIN for PCH load switch with an initial gate to charge pump voltage difference=3*VIN. For such a two-stage charge pump 254, the current input is to be 3Vct/Rdry (e.g., a transconductor gain of 3/Rdry and resistors=Rdrv/3, etc.). Thus, given an N-stage charge pump, the V to I transconductor gain=(1+N)/Rdrv. Similarly, with an N-stage charge pump, gate slope, GATE(t), can be represented as: GATE(t)=dVgate/dt=(N+1)*IREF/$C_{CT}$, where input voltage VIN powers the reference current IREF and the capacitor CT provides a capacitance $C_{CT}$ to generate a controlled voltage slope.

Figure 6A:
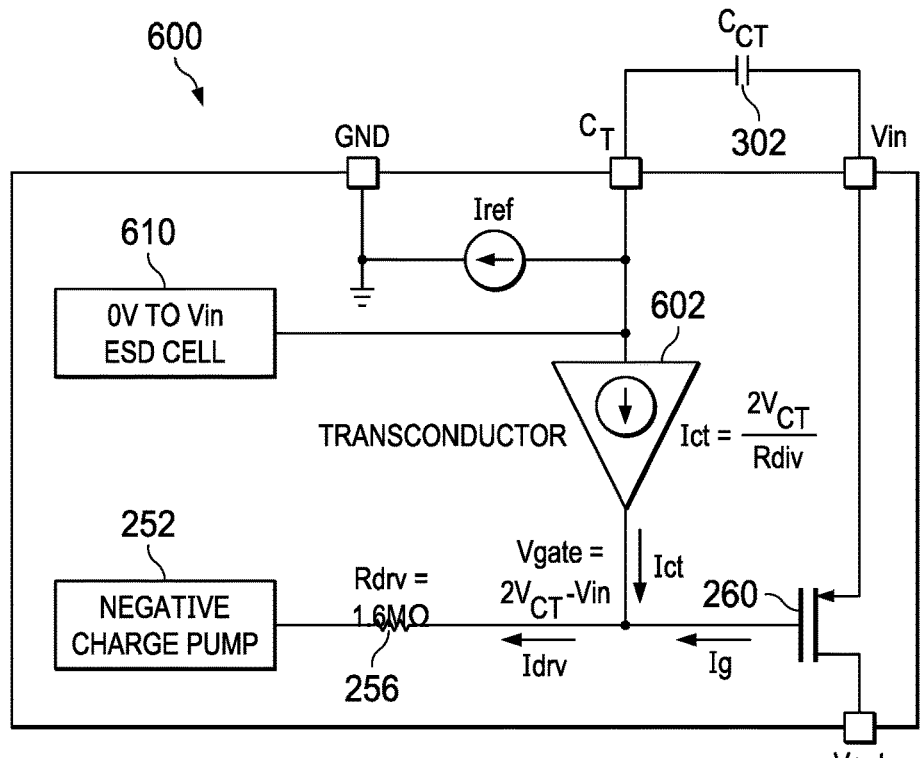
FIGS. 6A-6B illustrate an example constant gate slope control and driver circuit for a PMOS load switch.

FIG. 6A illustrates a schematic view of an example constant gate slope control and driver circuit 600 including a transconductor 602 to control the gate 260 with the charge pump 252, the resistive driver 256, and an ESD cell 610. The transconductor 602 separates the ESD cell 610 from the gate 260 to reduce or avoid leakage current effects. The example circuit 600 can be implemented as a chip to provide power to another device, circuit, chip, etc., and/or as part of a system-on-a-chip to provide and regulate power to other parts of the chip, etc.

Figure 6B:
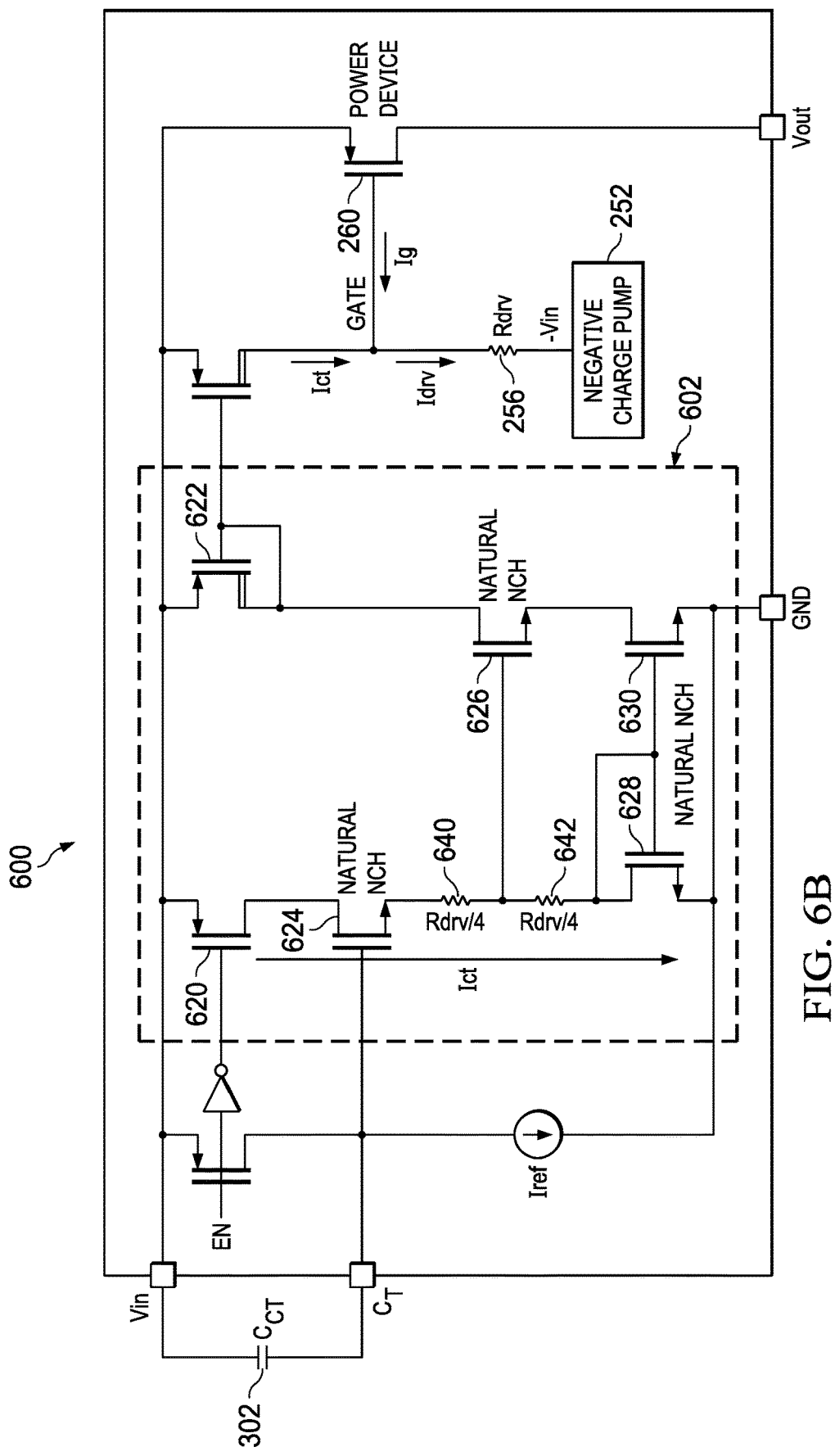

FIG. 6B illustrates a schematic view of the example circuit 600 showing component implementation detail for the example transconductor 602 with respect to the charge pump 252 and the gate 260. As shown in the example of FIG. 6B, the transductor 602 can be implemented using a plurality of transistors 620-630 (e.g., MOSFETs, other FETs, etc.), including natural N-channel (NCH) transistors (e.g., MOSFETs, etc.) 624-630, and resistors 640, 642 having a quarter of the resistance value of the resistive driver 256 (e.g., Rdrv/4).

Each natural or native N-channel transistor 624-630 is a transistor (e.g., a MOSFET) that operates in an intermediate mode between enhancement and depletion modes. For example, a natural N-channel MOSFET includes a natural thin oxide film formed over silicon during processing of other layers and has nearly zero threshold voltage, functioning as a weak pull-down in low-voltage applications, etc. While an enhancement mode MOSFET increases device conductivity when a voltage is applied to the gate and a depletion mode MOSFET reduces conductivity based on a voltage applied to the gate, a natural or native MOSFET has nearly zero threshold voltage and provide a weak pull-down for low-voltage applications where enhancement mode or depletion mode MOSFETs may be too strong. Thus, native mode MOSFETs can enable a load switch for low voltage electronic devices using low current and low voltage to avoid leakage and quiescent current effects, etc.

The transconductor 602, including transistors 620-630 and resistors 640-642, allows current Ict to flow through the transconductor 602 with a current Ict=2$V_{CT}$/Rdry to impact gate current Ig and gate voltage Vgate=2$V_{CT}$−VIN, for example. A corresponding Idrv current flowing through the resistor Rdry 256 becomes Idrv=(Vgate+VIN)/Rdrv, for example.

The current Ict flowing through the transconductor 602 slows down a gate discharge speed through its interaction with the driver current to provide a constant gate slope control, for example. Benefits of constant gate slope control include little ESD 610 leakage current loading to the negative charge pump 252, resulting in minimal $I_Q$, for example. The (0 to VIN) ESD cell 610 can also be implemented as a low-area cell on a low-cost die, for example. A linearly discharged gate also provides a better-controlled inrush current by reducing or eliminating fluctuations and/or other variability in gate voltage, for example. Further, changes enabled in capacitor CT pin rating (e.g., from −VIN~VIN to 0V~VIN) reduce system cost.

Figure 7A:
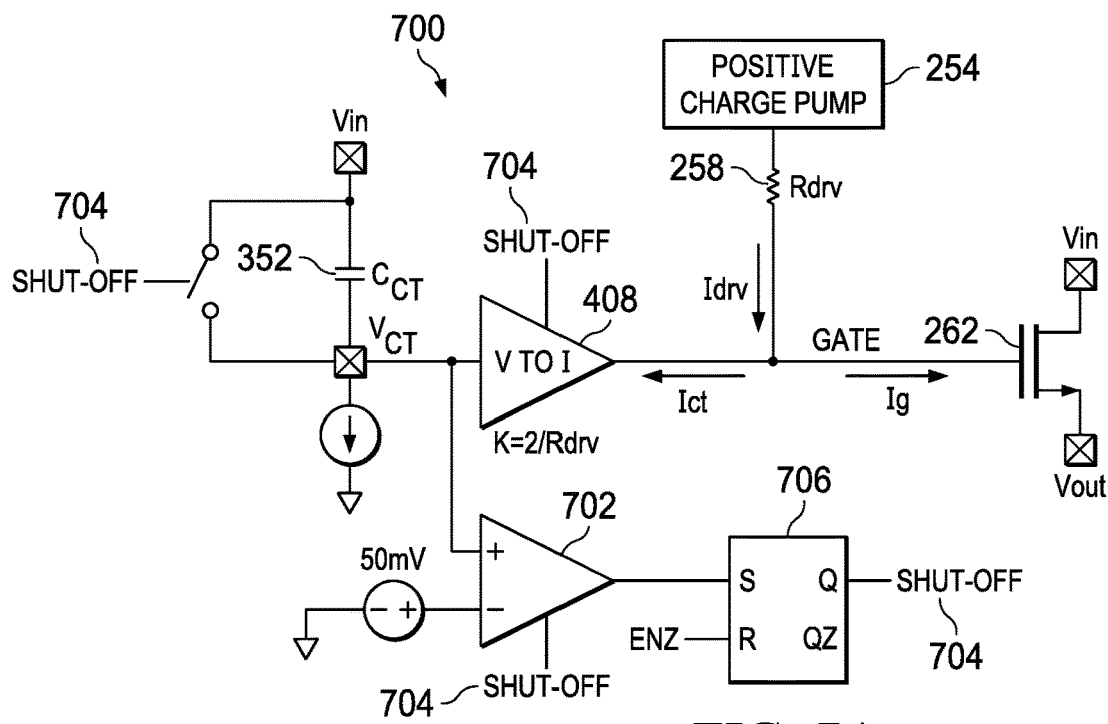
FIG. 7A illustrates a zero quiescent current implementation of an example NMOS load switch with constant gate slope control.

FIG. 7A illustrates a zero-$I_Q$ implementation of an example NMOS load switch 700 with constant gate slope control. To further refine the improved circuit design and reduce or eliminate unwanted quiescent current, the example circuit 700 includes shut-off circuitry to shut off the gate slope control circuitry when not needed so that zero quiescent current is produced. More specifically, the example circuit 700 includes a comparator 702, which compares $V_{CT}$ to ground or close to ground (e.g., within 50 mV, etc.) to determine when gate 262 voltage has reached maximum charge pump 254 voltage. When capacitor 352 voltage ($V_{CT}$) approaches ground, gate voltage has reached maximum charge pump voltage, so the $V_{CT}$ to 50 mV comparator 702 detects this condition and triggers a shut-off signal 704, which can be stored in a latch, flip-flop, or register 706, to shut off, deactivate, and/or otherwise disable gate slope control circuitry including the capacitor 352 and the transconductor 408, to make a zero quiescent current. $V_{CT}$ is also pulled up to VIN to prepare for a next soft-start, for example.

Figure 7B:
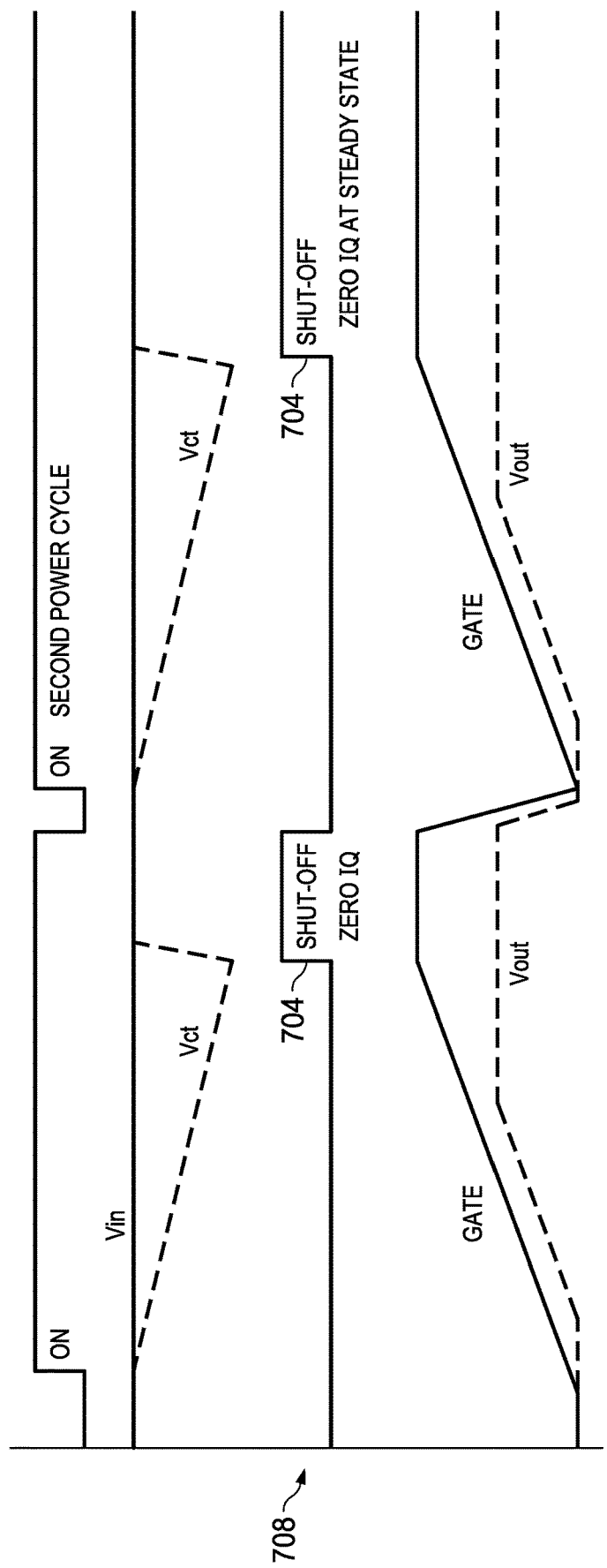
FIG. 7B depicts an example timing diagram associated with operation of the circuit of FIG. 7A.

FIG. 7B illustrates an example timing diagram 708 reflecting activation of the example circuit 700 and its shut-off signal 704. As shown in the example diagram 708, when the circuit 700 is turned on, $V_{CT}$ begins to decrease from VIN as the capacitor discharges. Gate 262 voltage is correspondingly increasing as current is applied to the gate 262, as is output voltage VOUT. When a rate of change in $V_{CT}$ plateaus, and $V_{CT}$ is close to ground (e.g., within 50 mV, etc.) (e.g., indicating that the gate voltage has reached its maximum and is "on"), the comparator 702 triggers the shut-off signal 704, which initiates a period of zero $I_Q$ because the circuit 700 is in steady state at maximum charge pump 254 voltage. During the shut-off 704 period, $V_{CT}$ is increased back to VIN. When the circuit 700 is off, VOUT and gate voltage decrease to ground. Upon start or on, $V_{CT}$ again decreases to ground as gate voltage and VOUT increase to steady state.

Figure 7C:
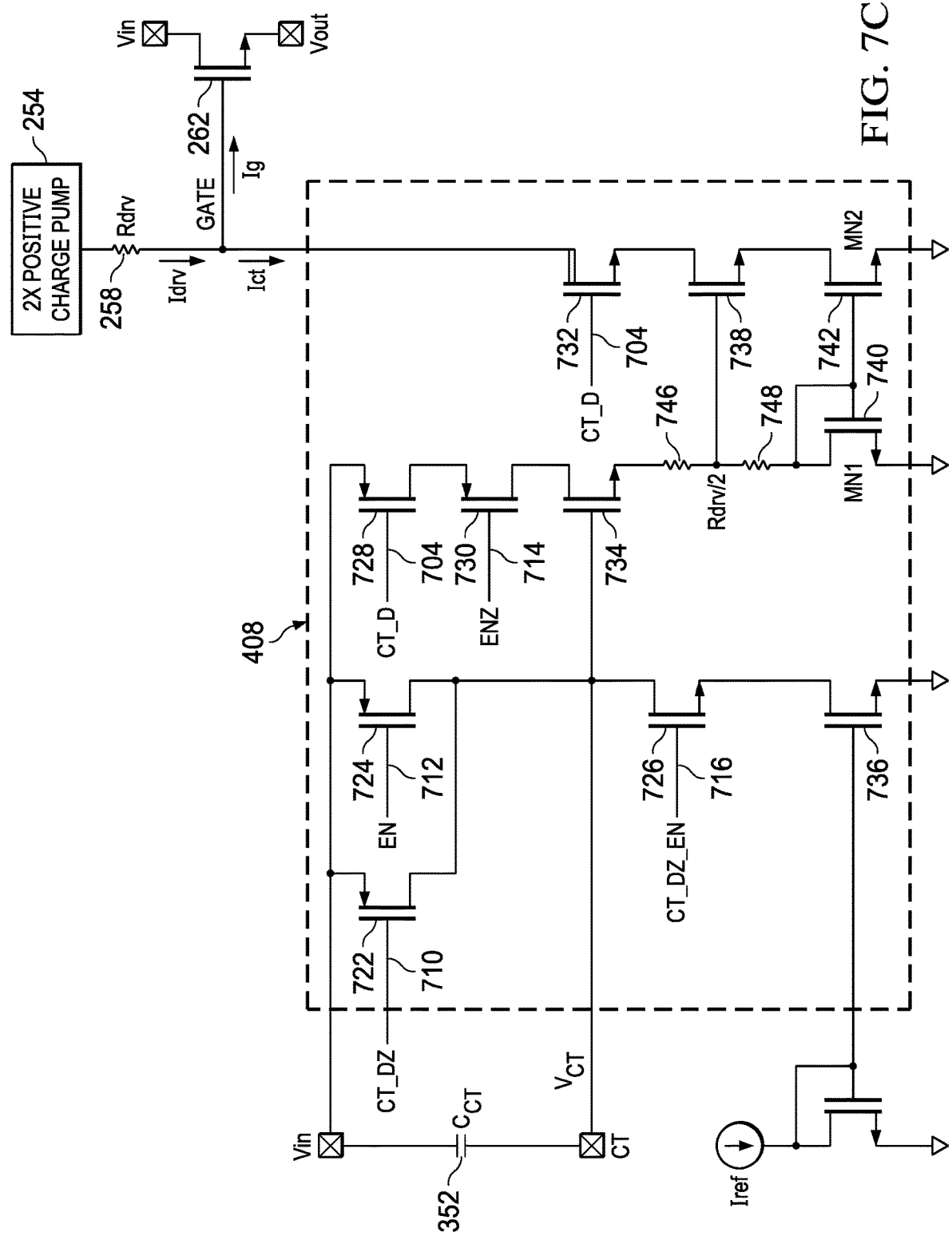
FIG. 7C depicts an example NMOS transistor implementation of cancellation current circuitry for the load switch of FIG. 7A.

FIG. 7C depicts an example NMOS transistor implementation of cancellation current circuitry in the transconductor 408 of the circuit 700 for NMOS constant gate slope control through generation of cancellation current Ict. The cancellation current Ict correlates with the driver current Idrv and the gate current Ig with respect to the gate 262, charge pump 254, and resistor Rdry 258, for example. An input voltage VIN and the capacitor CT 352 are connected via a plurality of transistors and resistors to generate and relay the current Ict, when enabled, with respect to a reference current $I_{REF}$, for example. When enabled and/or otherwise activated 704, 710-716, a plurality of transistor gates 722-742, including NMOS transistors MN1 740 and MN2 742, and resistors 746, 748 relay current Ict from the capacitor CT 352 to the gate 262.

Figure 7D:
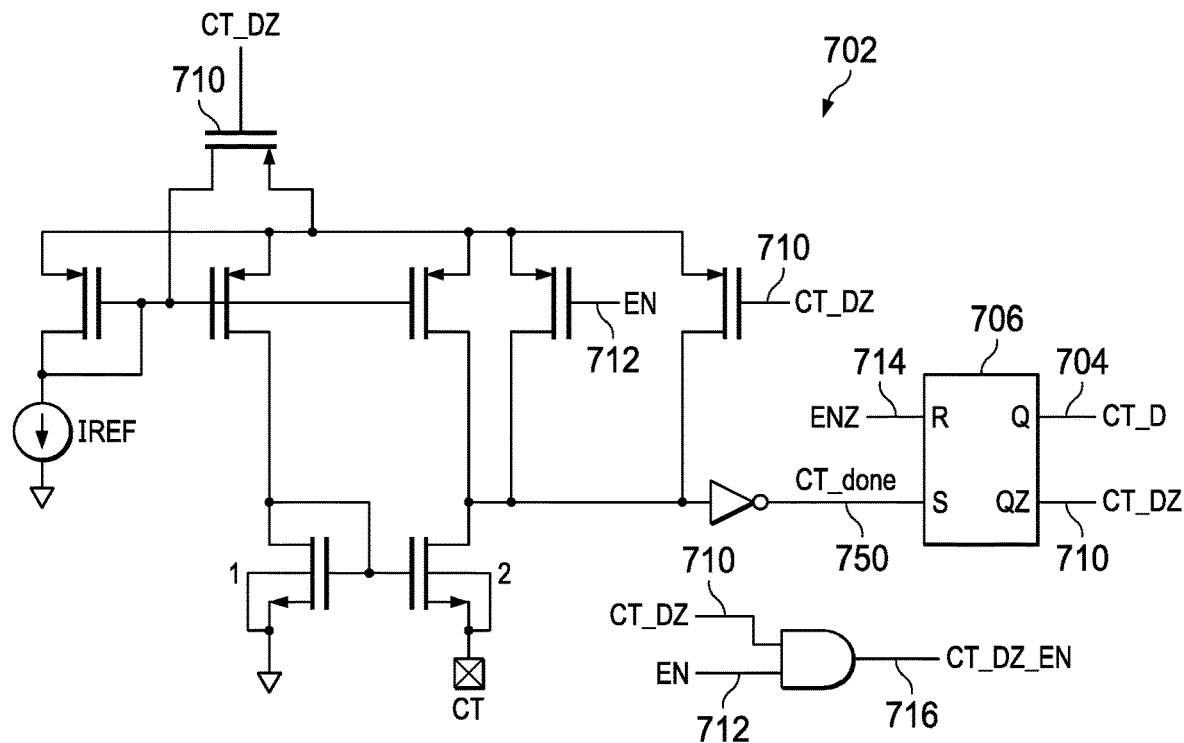
FIG. 7D depicts an example NMOS transistor implementation of shut-down detection circuitry for the load switch of FIG. 7A.

FIG. 7D depicts an example NMOS transistor implementation of shut-down detection circuitry, such as the comparator 702, generating the shut-off output signal 704 (represented as disable signals CT_D 704 and CT_DZ 710 in the example of FIG. 7D) to be stored in and provided by the S-R latch 706 and sent to gates of the transconductor circuit 408, capacitor 352, and comparator 702 to temporarily turn off or disable those components. By turning off the circuitry 352, 408, 702, quiescent current $I_Q$ can be reduced to zero, resulting in no leakage of current from the circuit 700 to connected component(s). As shown in the example of FIG. 7D, a CT_DZ EN enable or disable signal 716 can be formed by ANDing disable signal CT_DZ 710 and enable signal EN 712. A completion signal CT_done 750 can indicate when VCT is approximately ground, and the shut-off signal(s) 704, 710 are to be provided by the latch 706, for example.

Figure 8A:
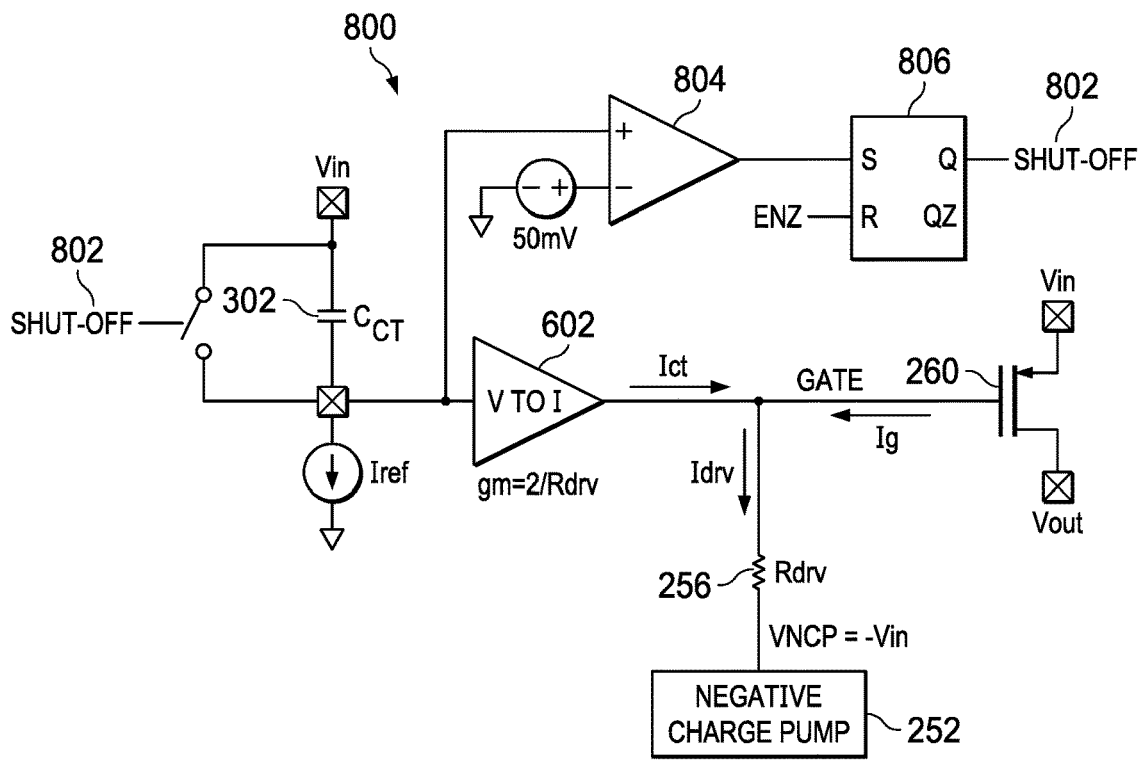
FIG. 8A illustrates a zero quiescent current implementation of an example PMOS load switch with constant gate slope control.
Figure 8B:
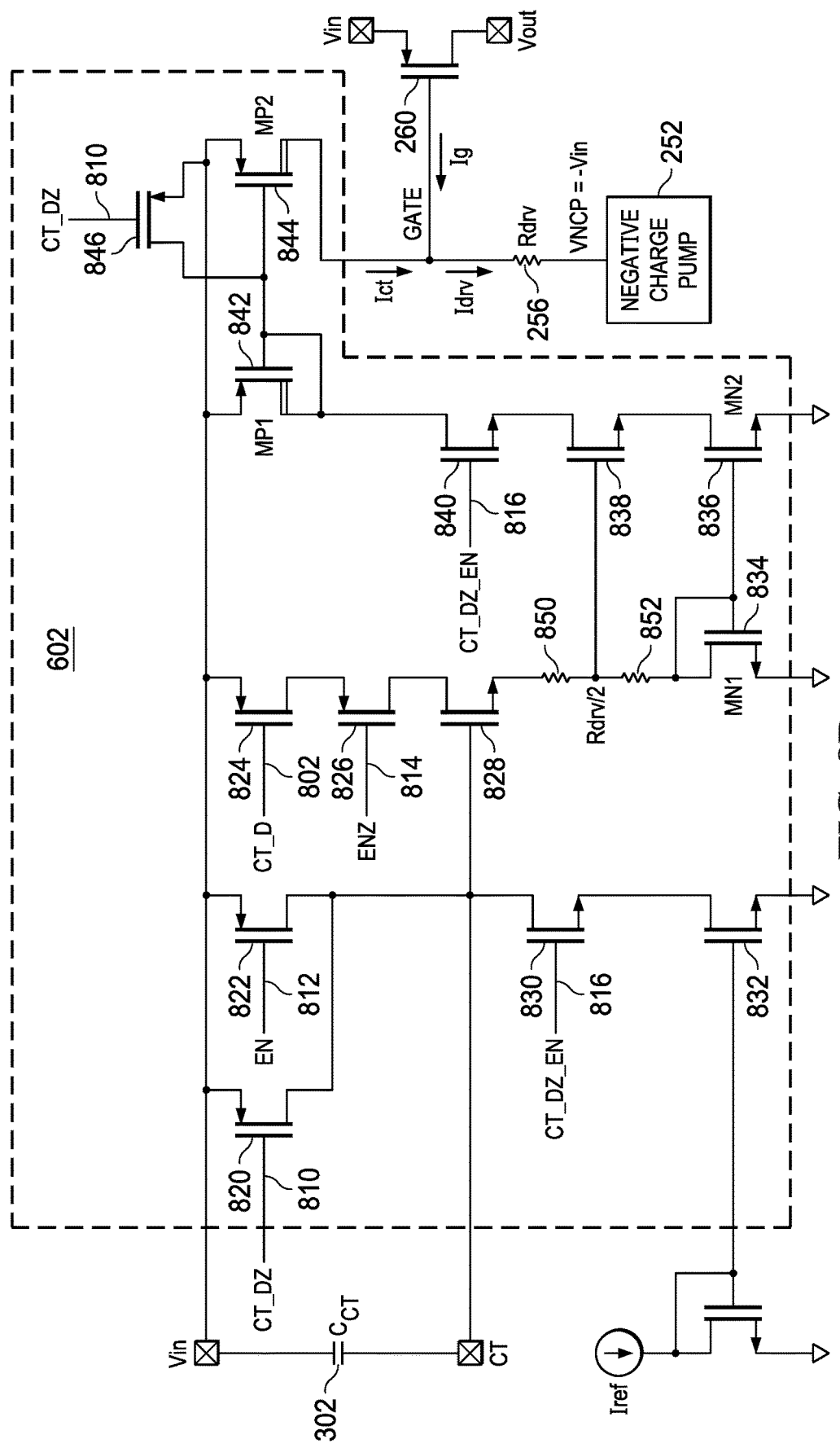
FIG. 8B depicts an example PMOS transistor implementation of cancellation current circuitry for the load switch of FIG. 8A.
Figure 8C:
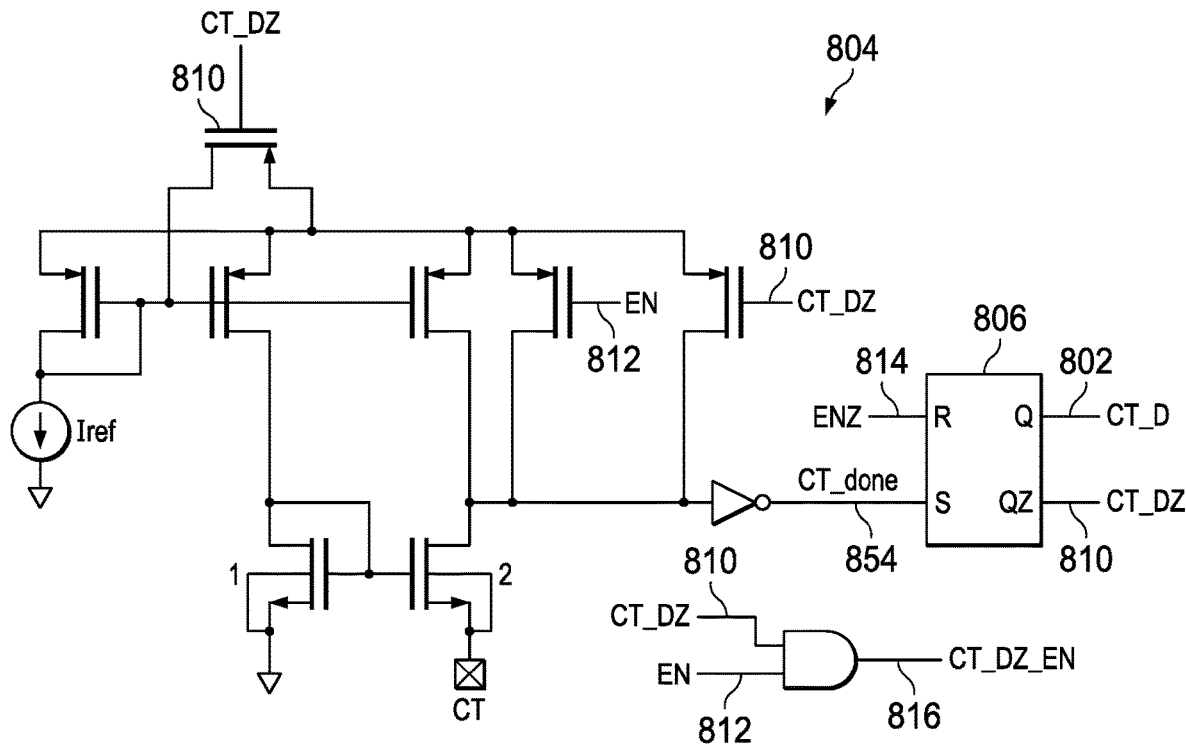
FIG. 8C depicts an example PMOS transistor implementation of shut-down detection circuitry for the load switch of FIG. 8A.

FIGS. 8A-8C depict example PMOS circuitry 800 corresponding to the NMOS circuitry 700 of FIGS. 7A-7D, with a negative charge pump 252 rather than a positive charge pump 254 to provide constant gate slope control to regulate gate voltage during activation using the capacitor 302 and transconductor 602 and help ensure zero to low quiescent current through shut-off circuitry once the gate 260 has been turned on. For example, FIG. 8A depicts an example a zero-$I_Q$ implementation of an example PMOS load switch 800 with constant gate slope control. As shown in the example of FIG. 8A, a shut-off signal 802 can be generated using a comparator 804. More specifically, the comparator 804 of the example circuit 800 compares $V_{CT}$ to ground or close to ground (e.g., within 50 mV, etc.) to determine when gate 260 voltage has reached maximum charge pump 252 voltage (e.g., is turned on or activated, which corresponding turns on the load switch to provide an output voltage to a connected electronic device). When capacitor 302 voltage ($V_{CT}$) approaches ground, gate voltage has reached maximum charge pump voltage, so the $V_{CT}$ to 50 mV comparator 804 detects this condition and triggers a shut-off signal 802, which can be stored in a latch, flip-flop, or register 806, to shut off, deactivate, and/or otherwise disable gate slope control circuitry including the capacitor 302 and the transconductor 602, to make a zero quiescent current. $V_{CT}$ is also pulled up to VIN to prepare for a next soft-start, for example.

FIG. 8B shows an example PMOS transistor implementation of cancellation current generation circuit implementing the transconductor circuit 602. The cancellation current Ict correlates with the driver current Idrv and the gate current Ig with respect to the gate 260, charge pump 252, and resistor Rdry 256, for example. An input voltage VIN and the capacitor CT 302 are connected via a plurality of transistors and resistors to generate and relay the current Ict, when enabled, with respect to a reference current $I_{REF}$, for example. When enabled and/or otherwise activated 804, 810-816, a plurality of transistor gates 820-846, including NMOS transistors MN1 834 and MN2 836 and PMOS transistors MP1 842 and MP2 844, and resistors 850, 852 relay current Ict from the capacitor CT 302 to the gate 260.

FIG. 8C depicts an example PMOS transistor implementation of shut-down detection circuitry, such as the comparator 804, generating the shut-off output signal 802 (represented as disable signals CT_D 802 and CT_DZ 810 in the example of FIG. 8C) to be stored in and provided by the S-R latch 806 sent to gates of the transconductor circuit 602, capacitor 302, and comparator 804 to temporarily turn off or disable those components. By turning off the circuitry 302, 602, 804, quiescent current $I_Q$ can be reduced to zero, resulting in no leakage of current from the circuit 800 to connected component(s). As shown in the example of FIG. 8C, a CT_DZ EN enable or disable signal 816 can be formed by ANDing disable signal CT_DZ 810 and enable signal EN 812. A completion signal CT_done 854 can indicate when $V_{CT}$ is approximately ground, and the shut-off signal(s) 802, 810 are to be provided by the latch 806, for example.

Figure 9A:
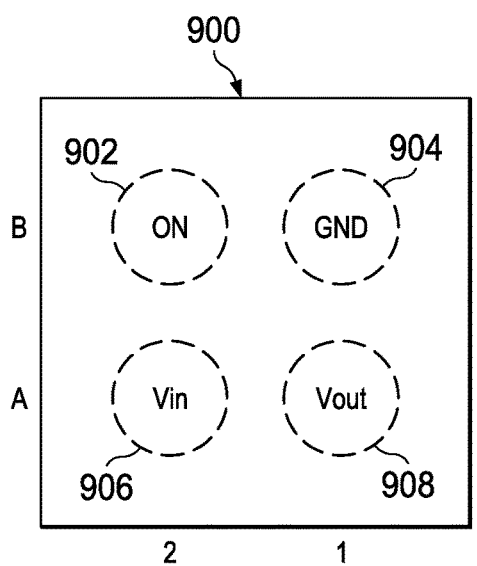
FIGS. 9A-9B illustrate example device packages including circuitry to implement a load switch.

The example circuits 100-800 described above can be packaged in a variety of packages or housings with interface pins to connect the load switch to a power supply, electronic device, other circuitry, etc. FIG. 9A illustrates an example 4-pin very thin small outline no lead (WSON) package 900 shown in a laser marking view providing contacts for ON 902, ground 904, input voltage VIN 906, and output voltage VOUT 908 to implement a load switch. A power supply can be connected to the input voltage contact 906, and an electronic device to be powered can be connected to the output voltage contact 908, for example. The example package 900 can be used to provide a power FET in a wafer-level chip-scale package (WCSP) using the load switch circuit described and disclosed herein to regulate power to another device such as a haptic driver, biosensor, light sensor, converter, regulator, etc. Such a FET can handle high power levels while also providing good efficiency at low voltages and with high commutation speed.

Figure 9B:
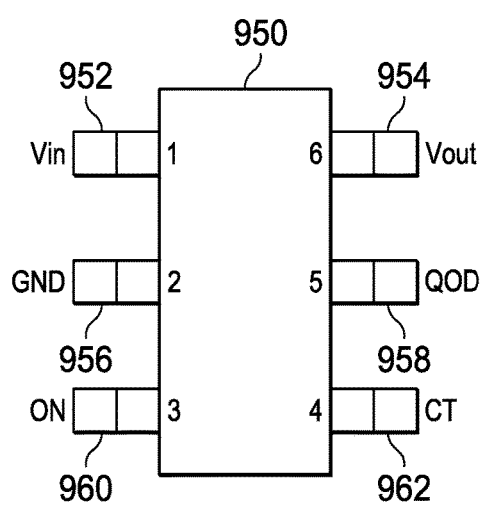

FIG. 9B illustrates an example 6-pin small outline transistor (SOT-23) package 950 to house load switch circuitry 100-800 shown in a top view including pins for VIN 952, VOUT 954, ground GND 956, quick output discharge (QOD) 958, ON 960, and external capacitor CT connection 962 to implement a load switch. The example package 950 can also be used to provide a power FET using the load switch circuit described and disclosed herein to regulate power to another device such as an active antenna system, remote radio unit, set top box, digital video recorder, etc.

In certain examples, a charge pump can be included in the package 900, 950 and/or provided as an external charge pump to be connected via an additional package pin (not shown) to the resistive driver (Rdrv) in the load-switch circuitry of the package 900, 950. In certain examples, the charge pump can be eliminated from a PMOS load switch. Instead, the resistive driver can be connected to ground and the gate of the PMOS load switch, and the transconductor gain, K, can be 1/Rdrv, for example. In an NMOS load switch, the charge pump is used to turn on the NMOS load switch.

From the foregoing, persons of ordinary skill in the art will further appreciate that the above disclosed apparatus, systems, and devices that provide constant gate slope for a load switch circuit while also providing zero quiescent current through shutdown of the circuit once gate slope control is completed. Certain examples provide a constant load-switch gate slope control and driver with a novel external capacitor time constant-based driver cancellation current for a resistive driver load-switch that enables a wide range turn-on time with a small area. Certain examples provide digital loop circuitry that detects when gate slope control is completed and shuts off circuitry to make zero quiescent current. The digital loop circuit also pulls up capacitor voltage to input voltage (VIN) for a next rise time control.

Certain examples provide technical advantages through a wide range of turn-on times including fast with no external capacitor and slow with a large capacitor. Certain examples generate no quiescent current using a shut-down or shut-off technique once gate slope control is complete. By providing a constant gate slope, inrush current does not vary with supply voltage and poly resistor variation. At the same time, the driver and gate slope control can be provided in a small footprint, and a voltage rating of the external capacitor can be reduced (e.g., based on a number of charge pump stages included in the circuit) over a traditional external capacitor. Certain examples improve upon prior current mirror driver circuit designs by providing a resistive gate driver circuit including a transconductor and comparator to facilitate load switch gate driving, gate slope control, and shut-off once gate slope control is complete.

While both NMOS and PMOS components have been disclosed and described herein, circuitry (e.g., the transconductor, comparator, etc.) can be implemented using N-type metal-oxide-semiconductor logic components or P-type metal-oxide-semiconductor logic components. Implementing the load switch circuit as an NMOS load switch with a positive charge pump or as a PMOS load switch with a negative charge pump has different advantages and disadvantages. For example, implementing an NMOS load-switch with a positive charge pump provides advantages including that VOUT follows GATE since the NMOS load-switch is acting as source follower amplifier. Thus, constant gate slope corresponds to a constant VOUT slope. Additionally, for the same on-resistance, the NMOS load-switch is smaller than the equivalent PMOS load-switch, for example. However, the NMOS load-switch allows a higher leakage current than the PMOS load-switch when the load switch is turned off.

Conversely, when a PMOS load-switch is implemented, when the load switch is turned off, its leakage current is much smaller than that of the NMOS load-switch. This can be due to the PMOS load switch having a higher source resistance, slower mobility (hole), and higher threshold voltage than the equivalent NMOS load switch, for example. Further, a current limit design is easier to implement in PMOS since the PMOS load-switch is acting as a common source amplifier. However, a constant gate slope does not produce a constant VOUT slope since the PMOS load-switch is acting as a common source amplifier. Nonetheless, with a given output resistance and output capacitance, a slower gate slope produces a slower VOUT rise time.

Additionally, the PMOS load switch can be turned on at low VIN (e.g., 1V) with a single stage charge pump. For example, when VIN=1V, an NMOS load switch Vgs is 1V (e.g., Vout=1V and charge pump voltage=2V), which is close to Vt. However, when VIN=1V, a Vgs of the PMOS load switch is −2V with a single stage charge pump (e.g., VIN=1V, charge pump voltage=−1V).

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A load switch circuit comprising:
a reference voltage terminal;
a transistor having a gate, a source and a drain;
a transconductor having a shutoff input, a transconductor input and a transconductor output, the transconductor output coupled to the gate of the transistor, and the transconductor configured to disable the transconductor output responsive to a shutoff signal at the shutoff input;
a comparator having a first input, a second input and a comparator output, the first input coupled to the transconductor input, the second input coupled to the reference voltage terminal, and the comparator configured to provide a comparison signal at the comparator output responsive to a voltage at the first input reaching a voltage at the second input;
a charge pump having a charge pump output;
a shutoff circuit having a circuit input and a circuit output, the circuit input coupled to the comparator output, the circuit output coupled to the shutoff input, and the shutoff circuit configured to provide the shutoff signal at the circuit output responsive to the comparison signal; and
a resistor coupled between the charge pump output and the gate of the transistor.

2. The load switch circuit of claim 1, wherein the transconductor is configured to convert a voltage at the transconductor input to a current at the transconductor output, the load switch circuit further comprises a power supply terminal, the transistor is adapted to be coupled between the power supply terminal and a load, and the transistor is configured to deliver power from the power supply terminal to the load responsive to the current.

3. The load switch circuit of claim 1, wherein the shutoff circuit includes a latch.

4. The load switch circuit of claim 3, wherein the latch is configured to latch the shutoff signal.

5. The load switch circuit of claim 1, further comprising a power supply terminal and a capacitor, the capacitor coupled between the power supply terminal and the transconductor input.

6. The load switch circuit of claim 5, wherein the capacitor is configured to provide a voltage to the transconductor input.

7. The load switch circuit of claim 1, wherein the transconductor and the comparator include N type metal-oxide-semiconductor logic components.

8. An apparatus comprising:
a power supply terminal;
a ground terminal;
a driver having an enable input, a driver input and a driver output, the driver output adapted to be coupled to a gate of a transistor, the driver configured to provide a gate voltage at the driver output responsive to the driver input, the gate voltage causing the transistor to deliver power, in which the driver includes a charge pump and a resistor, the resistor is coupled between the charge pump and the driver output, the driver is configured to enable the driver output responsive to an enable signal at the enable input, and the driver is configured to disable the driver output responsive to a disable signal at the enable input; and a gate slope control circuit having a circuit output coupled to the driver input, the gate slope control circuit configured to control a rate of change over time of the gate voltage, and the gate slope control circuit including a capacitor and a reference current source, in which the capacitor is coupled between the power supply terminal and the reference current source, the reference current source is coupled between the capacitor and the ground terminal, and the gate slope control circuit includes a latch coupled to the enable input and configured to latch the enable signal or the disable signal.

9. The apparatus of claim 8, wherein the driver includes a transconductor having a voltage input terminal and a current output terminal, in which the voltage input terminal is coupled between the capacitor and the reference current source, and the current output terminal is adapted to be coupled to the gate.

10. The apparatus of claim 9, wherein the gate slope control circuit is configured to pull up the gate voltage to an input voltage level when the latch is latching the disable signal.

11. The apparatus of claim 9, wherein the gate slope control circuit includes a comparator having a comparator input and a comparator output, the comparator input coupled to the transconductor input, the comparator output coupled to the latch, and the comparator configured to provide the disable signal at the comparator output responsive to a voltage at the transconductor input reaching a threshold voltage.

12. The apparatus of claim 8, wherein the driver and the gate slope control circuit include N type metal-oxide-semiconductor logic components.

* * * * *